3,484,698

PARAMETRIC AMPLIFIER CIRCUIT OPERATING IN A PSEUDO-DEGENERATE MODE

Michel Ruppli, Saint Gratien, France, assignor to Compagnie Francaise Thomson Houston-Hotchkiss Brandt, Paris, France Filed Feb. 27, 1967, Ser. No. 618,634
Claims priority, application France, Mar. 8, 1966, 52,477
Int. Cl. H03f 7/04
U.S. Cl. 325—442 9 Claims

ABSTRACT OF THE DISCLOSURE

The circuit includes a parametric amplifier in which the pump frequency is selected at a value twice the sum of the input signal frequency plus the selected intermediate-frequency value for the desired output signal. A common local oscillator producing a wave at half said selected pump frequency feeds one input of a mixer having its second input connected to the parametric amplifier, and also feeds by way of a frequency-doubler the pump input of the parametric amplifier, and the mixer output delivers the desired amplified I-F signal.

BACKGROUND

Figure 1:
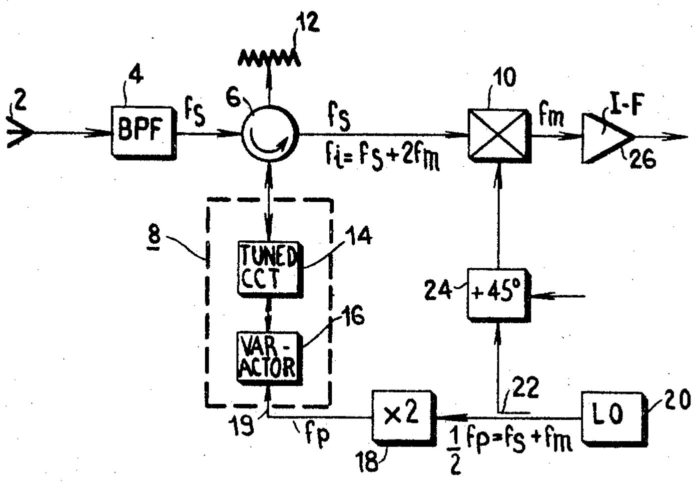

Parametric amplifiers are devices that use the nonlinear properties of a variable reactor to provide low-noise amplification. A parametric amplifier broadly comprises a variable reactor or varactor in the form of a variable-capacitance diode, positioned in a resonant cavity provided with tuning means. An ultra-high-frequency input signal to be amplified is coupled to the cavity so that the resulting variable electric field tends to vary the capacitance of the varactor at the input signal frequency. Further, so-called pump energy at a pump frequency, is coupled to the varactor to vary the capacitance thereof at the pump frequency. The resulting interaction of the input signal energy and the pump energy is shown mathematically to generate a plurality of energy terms at different frequencies and having different amplitudes. Using appropriate filter means, only a few selected ones of the generated frequencies, generally representing first-order terms of the series, are retained at the output of the parametric amplifier, which output is common with the input. In this way, amplification and/or frequency-conversion of the input signal energy can be obtained.

The great advantage of parametric amplification is its low noise output even at high gain values, so that parametric amplifiers are adavntageously used as the initial stage in UHF receiving systems having high signal-to-noise ratio requirements.

Parametric amplifiers can be divided into different classes depending on the particular frequencies that are effectively utilized at the output of the device. This invention deals principally with that class in which the amplified signals at the output of the parametric amplifier include a first amplified signal at the same frequency as the input signal, and a second amplified signal at a so-called idler frequency, which is the difference between the pump frequency and the input signal frequency. Such systems are sometimes known as negative-resistance amplifiers.

Parametric amplifiers can further be subdivided into categories depending on the particular value of the pump frequency that is used, in relation to the frequency of the input signals. In this respect it has been proposed to distinguish between so-called normal or "non-degenerate" parametric amplifiers, and "degenerate" ones. In the second class, that of degenerate amplifiers, the pump frequency $f_p$ is exactly equal to twice the input signal frequency $f_s$, i.e., $f_p=2f_s$. It follows necessarily that the idler frequency equals the input signal frequency, $f_i=f_s=\frac{1}{2}f_p$.

In the non-degenerate type on the other hand the pump frequency is usually selected many times higher, e.g. 5 to 10 times higher, than the input frequency, and hence the idler frequency also is considerably higher than the input frequency.

The degenerate mode of operation has several important advantages. Its noise output is particularly low. It is comparatively simple. It is able to handle broadband input signals, albeit with a proviso to be specified presently. Probably its chief attraction stems from the relatively low value of the pump frequency required, which greatly simplifies the construction of the local oscillator as well as reducing power requirements. On the other hand, degenerate amplifiers have an important disadvantage in that they can only accept input signals that have a symmetrical modulation spectrum (e.g., symmetrical sidebands), this requirement arising out of the fact that the input and idler frequencies have central frequency values that coincide, so that the modulation bands become superposed in mutually inverted relation.

It would therefore be desirable to provide a parametric amplifier system having most of the advantages of the degenerate type while being free from the restriction as to the symmetrical modulation spectrum of the input signal.

It is customary to feed the output of the parametric amplifier to one input of a mixer whose second input is fed an auxiliary wave from a local oscillator, so selected that the mixer output delivers a signal at a prescribed intermediate frequency. This is then usually passed through a conventional I-F amplifier stage. When this general layout is used with a degenerate amplifier, it is essential, if the low-noise characteristic of the latter is to be preserved, that accurate phase sychronism be maintained between the wave at semi-pump frequency $\frac{1}{2}f_p$ and the incident signal frequency $f_s$, regardless of the phasing of the local oscillator. This phase synchronism requirement involves the use of phase discrimination and phaselock loops. The basically simple circuitry of the degenerate parametric amplifier is thus seriously complicated.

SUMMARY OF THE INVENTION

The system of the invention may be characterized in that the pump frequency of the parametric amplifier is selected equal to twice the sum of the input signal frequency plus a prescribed output frequency value in the I-F range, and in that a common local oscillator is used to deliver both an auxiliary wave applied to an input of a mixer having the output of the parametric amplifier applied to its other input, and also to produce, by way of a frequency doubler, the said pump frequency.

In such a system, the pump frequency is only slightly higher than a value twice the input signal frequency (by an amount equal to twice the prescribed output frequency in the I-F range). The system therefore resembles in many respects a degenerate amplifier system as this term has been defined above. In particular, the system of the invention, which operates in what can be termed a "pseudo-degenerate" mode, has the advantages of low pump frequency, low power consumption, and broadband input signal capability, that characterize degenerate parametric amplifiers. However, because the pump frequency is selected at a value different from twice the input signal frequency, the input and idler frequencies at the system output do not coincide, and hence the limitation as to symmetry of the modulation spectrum, which has restricted the usefulness of degenerate amplifiers in the past, is completely eliminated. The improved system can accept input signals having any desired modulation spectral pattern.

Furthermore, as will be demonstrated mathematically herein, selecting the pump frequency at the precise value specified above, i.e., twice the sum of the input frequency plus the prescribed output frequency, produces the unexpected result that both the amplified signals at the input frequency and the idler frequency, can be heterodyned in a mixer with a common auxiliary wave at precisely one half the pump frequency. This makes it possible to utilize a common local oscillator both to deliver the auxiliary wave for the mixer and, through a frequency doubler, to provide the pump energy for the parametric amplifier as indicated above. This not only yields a net saving of one local oscillator, but furthermore it eliminates the complicated phaselock circuitry required in conventional systems of the type indicated above.

The resulting system is therefore more simple, compact, lightweight, rugged and inexpensive than conventional parametric systems of comparable performance. While the noise output in a system according to the invention may be slightly higher than that of a conventional degenerate parametric amplifier system for reasons that will be pointed out, the increase is insignificant for many applications and may be reduced where desired.

Objects accomplished by this invention, therefore, are the provision of improved parametric amplifier systems having the advantageous features just enumerated.

THE DRAWINGS

Figure 2:
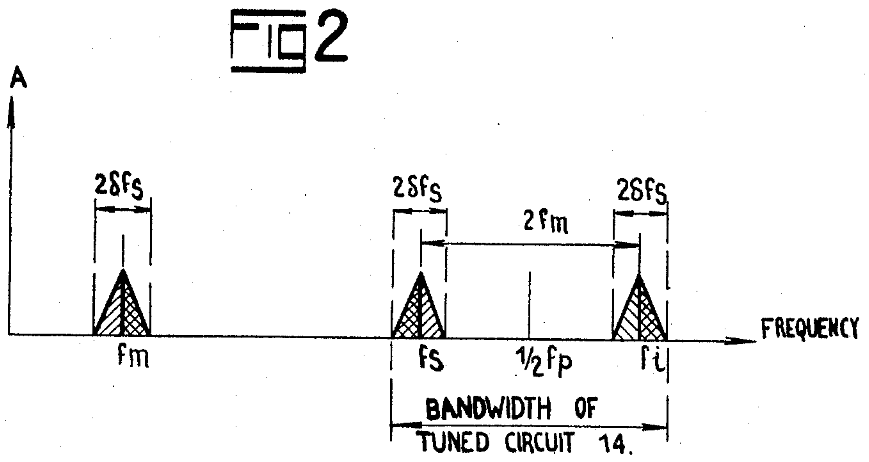

FIG. 1 is a schematic representation of an improved parametric amplifier system according to a form of embodiment of the invention; and FIG. 2 is a conventional spectral diagram illustrating the relationships between the pump frequency ($f_p$), input signal frequency ($f_s$), idler frequency ($f_i$) and prescribed output frequency ($f_m$) in a system according to the invention.

DETAILED DESCRIPTION

The exemplary embodiment of the invention will now be described in detail with reference to the drawings.

The circuit diagrammatically shown in FIG. 1 includes an antenna 2 as a source of ultra-high-frequency input signals. The input signals are passed through a bandpass filter 4 to one terminal of a four-port circulator 6. The circulator has a second port connected to the common input-output line of a parametric amplifier generally designated 8, a third port connected to a mixer circuit 10, and a fourth port connected to a dissipating impedance load 12. Circulator 6 is conventional and may use the nonisotropic properties of ferrites or garnets to permit energy to flow substantially freely in the circulatory direction indicated by the arrow while opposing energy flow in the reverse sense.

The parametric amplifier 8 is schematically shown as including a filter or tuning device 14 and a variable reactor, or varactor 16. The varactor 16 is provided with the usual pumping input designated 19 which serves to apply a pumping signal at the frequency $f_p$ for varying the capacitance of varactor 16 at a corresponding frequency. While amplifier 8 is generally conventional, it is important to note that the tuned circuit 14 thereof should be adjusted to pass both the input frequency $f_s$ and idler frequency $f_i$ as these frequencies will be later defined.

The mixer 10 may be any suitable mixer circuit, e.g., one comprising diodes, and delivering the sum of differences of the signal frequencies applied to its inputs, only the difference signal being utilized at the mixer output.

As shown, the pump input 19 of the parametric amplifier is connected to the output of a frequency doubler circuit 18 supplied from the output of a local oscillator 20. Oscillator 20 produces a stable local wave at the frequency $\frac{1}{2} f_p$ so as to provide the desired pump frequency at the output of doubler 18. The local oscillator output is, moreover, tapped by means of a coupler 22 and passed by way of a phase shifter 24 to the second input of mixer

10. The output signal from the mixer is then passed through a conventional intermediate-frequency amplifier 26.

The general operation of the system described is similar to that of a conventional parametric amplifier of the negative-resistance type, except for the features to be noted later. The input signal from antenna 2 at the frequency $f_s$ is filtered in filter 4 so as to retain substantially the useful frequency band therein, and the filtered input signal at the frequency $f_s$ is applied through circulator 6 to the input of parametric amplifier device 8. In this device, the input signal produces a variable electric field which causes the reactance of varactor 18 (i.e., its capacitance in the common case where the varactor is a variable-capacitance diode), to vary at the frequency $f_s$ of said input signal. At the same time, the varactor 18 is subjected to the variable field of the pump signal at frequency $f_p$. The resulting interaction between the energy of the input signal and the pump signal produces an amplification of the input signal at frequency $f_s$ and simultaneously generates another amplified signal at a so-called idler frequency $f_i$, equal to the difference between the pump signal frequency and input signal frequency, i.e., $$f_i = f_p - f_s \qquad (1)$$

The tuned circuit or filter 14 is predetermined to pass both the signal frequencies $f_s$ and $f_i$ together with their modulation bands, as will later appear more clearly. Thus, the amplified signals at the frequencies $f_s$ and $f_i$ which constitute the output of the parametric amplifier device are passed from the output line of said device (which is common with the input line thereof), and by way of circulator 6 to the first input of the mixer 10. In the mixer the amplified signals are mixed or heterodyned with the local frequency $\frac{1}{2} f_p$ from oscillator 20.

The description will now be continued with reference to the spectral chart of FIG. 2. In that chart, the input signal frequency $f_s$ is indicated together with its two modulation sidebands, here shown as being of equal width $\pm\delta f_s$. This representation of the input signal is exemplary only, since as will be shown later the system of the invention is equally operative regardless of the type of input signal modulation used, including dissymetrical sidebands or single sideband modulated signals.

The idler frequency $f_i$ is also indicated on the chart. Since relation (1) given above can be rewritten $$\tfrac{1}{2} f_p = \tfrac{1}{2}(f_s + f_i)$$

it is evident that the input and idler frequencies $f_s$ and $f_i$ are symmetrically positioned on opposite sides of the pump semi-frequency $\frac{1}{2} f_p$, as indicated on the chart. Further, according to the known laws of parametric amplifier operation, the modulation frequency band of the idler signal is inverted with respect to that of the amplified input signal. To indicate this condition, the opposite sidebands of each signal are shown with different cross hatching, and the corresponding sidebands of the respective signals are shown similarly hatched, thereby making the just-mentioned inverted relationship clearly apparent. It should moreover be noted that the amplitudes of the amplified input signal and the idler signal are substantially identical.

According to the present invention, the pump frequency $f_p$ is selected at a value such that the pump semi-frequency $\frac{1}{2} f_p$ exceeds the input frequency $f_s$ by an amount equal to the desired output frequency $f_m$ of the system, i.e., is such that $$\tfrac{1}{2} f_p - f_s = \pm f_m \qquad (2)$$

In the system of the invention, therefore, the following relations obtain between the pump frequency, input frequency, idler frequency and output frequency:

$$\pm f_m = \tfrac{1}{2} f_p - f_s \text{ and } \pm f_m = f_i - \tfrac{1}{2} f_p \qquad (3)$$

the first of these relations being the same as Equation 2 above, while the second relation is obtained by inserting $f_i$ as derived from Equation 1 into Equation 2.

In the pair of Equations 3, $f_m$ must be taken either with the plus sign in both equations, or with the minus sign in both equations. With this in mind, the following additional equation is immediately derivable:

$$f_i - f_s = 2f_m \quad (4)$$

The spectral chart of FIG. 2 has been drawn up on the assumption that the plus sign is chosen in Equation 2 hence also in both Equations 3. It is evident that the corresponding chart for the case where $f_m$ is taken with the minus sign in those equations, would differ from FIG. 2 merely in that the labels $f_s$ and $f_i$ would be interchanged therein. It is to be understood that either of the two spectral charts or frequency distributions just referred to may be used according to this invention.

Since the output frequency $f_m$ is an intermediate frequency considerably lower than the input frequency $f_s$, Equation 4 shows that the idler and input frequencies differ by a relatively small amount in the parametric amplifier of the invention, that is, the invention is dealing with a "pseudo-degenerate" type of parametric amplifier system as the type has been earlier defined, As earlier described according to the invention both amplified signals at frequencies $f_s$ and $f_i$ are simultaneously heterodyned in mixer 10 with the local frequency $\frac{1}{2}f_p$ equal to the pump semi-frequency, phase shifted in phase shifter 24. It will be shown by mathematical analysis that when a heterodyning signal of the said frequency $\frac{1}{2}f_p$ is used and when the phase shift applied to it is of a suitable amount, in theory +45°, with respect to the equal frequency signal applied to doubler 18, then the mixer 10 will produce an output in which the component at frequency $\frac{1}{2}f_p$ is suppressed, and the said mixer output contains as the main frequency components therein, the desired output frequency $f_m$ and the said modulation sidebands of the input signal. It is also shown that the modulation bands in the output signal represent the voltage sums of respectively corresponding bands in both the amplified signals $f_s$ and $f_i$. That is, referring to the chart of FIG. 2, the I-F output signal having the selected center frequency $f_m$ includes a lower sideband representing the voltage sum of the lower sideband of the $f_i$ signal and the upper sideband of the $f_s$ signal, and includes the upper sideband of the $f_i$ signal and the lower sideband of the $f_s$ signal. From this it will be apparent that the system will operate correctly regardless of whether or not the modulation sidebands of the input signal are symmetrical, or in fact whether two sidebands or a single sideband are involved.

This feature is in marked contrast with the operation of conventional parametric amplifiers of the degenerate type. In these latter, as earlier indicated, the frequencies $f_s$ and $f_i$ are equal, so that the output signals from the degenerate parametric amplifier are superposed, including their modulation sidebands. It is therefore essential in such an amplifier that the frequency spectrum of the input signal be strictly symmetrical if the system is to work properly.

As indicated above the desired type of operation is obtained in the system described herein when the local signal from oscillator 20 at frequency $\frac{1}{2}f_p$ is applied to the mixer 10 with a proper phase angle over the same signal as applied to frequency doubler 18 for producing the pump wave. While in theory the correct phase angle is +45°, in practice it may depart somewhat from this value, and consequently phase shifter 24 is preferably made adjustable, as indicated by an arrow.

The coupling means for introducing the input signal into, and extracting the amplified signals from, the parametric amplifier of the invention is shown in FIG. 1 as a four-terminal circulator, and the use of this particular coupling means is preferred for the following reasons. During operation of the system, impedance mismatches are liable to occur in which part of the energy applied from the parametric amplifier through circulator 6 to the mixer 10 may be reflected back from the mixer input into the circulator. That portion of the reflected energy that is at the input signal frequency $f_s$ would then be passed by the input filter 4 and absorbed in the antenna and would not therefore be reinjected into the parametric amplifier to disturb the operation thereof. However, the reflected energy at the idler frequency $f_i$ cannot pass filter 4 and would be reflected therefrom back into the circulator and thence fed back into the varactor 16. The feedback action could render the parametric amplifier unstable. It is in order to avoid this source of instability that the four-terminal circulator, having a low impedance load 12 connected to its fourth terminal, is used. The load 12 thus serves to decouple the mixer 10 from the varactor 16 for the idler-frequency energy in the reverse sense of flow of said energy. The four-terminal circulator 6 can conveniently be constructed from two series-connected three-terminal circulators in a conventional manner. It is, however, to be understood that the requisite type of coupling between the input filter 4, parametric amplifier 8 and mixer 10 may be provided by means other than that shown provided suitable steps are taken to prevent the abovementioned feedback of idler energy.

As regards the filter or tuned circuit 14, this conveniently forms part of the parametric amplifier structure and can assume any of the conventional forms commonly used for the purpose in parametric amplifiers. As indicated earlier, the circuit 14 must pass a frequency band which includes both the input and idler frequencies $f_s$ and $f_i$ together with their modulation bands. Referring to FIG. 2, it will thus be seen that circuit 14 should have a pass band centered at $\frac{1}{2} f_p$ and having a width $2(f_m + \delta f_s)$.

The central concept of the invention will now be disclosed in greater detail by a mathematical analysis.

The amplified signal voltages at the frequencies $f_s$ and $f_i$ delivered from the output of parametric amplifier 8 can be expressed in the standard complex form by the equations:

$$V_s = |V_s| \exp\{j(w_s t + \phi_s)\} \quad (5)$$

$$V_i = |V_i| \exp\{j(w_i t + \phi_i)\} \quad (6)$$

where the $w$'s represent angular frequencies, e.g., $$w_s = 2\pi f_s$$

and $\phi_s$ and $\phi_i$ represent the phase angles of the voltages referred to an angle reference presently indicated.

From the known theory of parametric amplifiers the following relation is known to hold between the amplified voltages $V_s$ and $V_i$ (cf. P. Penfield & R. Rafuse, "Varactor Applications," M.I.T. Press, 1962):

$$RV_i = \frac{S_1}{jw_s} V_s^* \quad (7)$$

In this equation, R is the total resistance of the parametric amplifier circuit including input circuit resistance, and $S_1$ is a complex quantity which is the first-order term of the elastance of the varactor 16 used when exposed to the pump frequency $f_p$. The symbol $V_s^*$ denotes the conjugate complex quantity of $V_s$. $S_1$ can be written in the standard form $$S_1 = |S_1| \exp(jw_p t) \quad (8)$$

when the varactor oscillation frequency is taken as the phase angle reference mentioned above. From Equation 5:

$$V_s^* = |V_s| \exp\left\{-j\left(w_s t + \phi_s\right)\right\} \quad (9)$$

Substituting (8) and (9) into (7) and reducing:

$$V_i = \frac{1}{Rw_s} |S_1||V_s| \exp\left\{j\left(-\frac{\pi}{2} + w_p t - w_s t - \phi_s\right)\right\} \quad (10)$$

The calculation up to this point would hold for any conventional negative-resistance parametric amplifier system. The central concept of the present invention relating to the choice of the pumping frequency $f_p$ will now be introduced. The relations 3 of the present invention can be rewritten as follows (putting $\epsilon=\pm1$):

$$w_s=\tfrac{1}{2}w_p-\epsilon w_m \quad (11)$$

$$w_i=\tfrac{1}{2}w_p+\epsilon w_m \quad (12)$$

Substituting 11 into 5 and 12 into 6 we get:

$$V_s=|V_s| \exp\{j(\tfrac{1}{2}w_pt-\epsilon w_mt+\phi_s)\} \quad (13)$$

and $$V_i=|V_i| \exp\{j(\tfrac{1}{2}w_pt+\epsilon w_mt+\phi_i)\} \quad (14)$$

Substituting 11 into 10 and reducing:

$$V_i=\frac{1}{Rw_s}|S_1||V_s| \exp\left\{j\left(\frac{1}{2}w_pt+\epsilon w_mt-\phi_s\frac{\pi}{2}\right)\right\} \quad (15)$$

Now, comparing 14 and 15, we see that by identifying the moduli and arguments, respectively, in the two expressions for $V_i$ we can write:

$$|V_i|\equiv\frac{1}{Rw_s}|S_1||V_s| \quad (16)$$

and $$\phi_i\equiv-\phi_s-\frac{\pi}{2} \quad (17)$$

From the first of these relations, 16, involving the moduli, it is seen that the amplitudes of the amplified signals at the input and idler frequencies are very nearly identical. This is true because for the high gain values here involved, R can be written $$R=\frac{|S_1|}{\sqrt{w_iw_s}} \text{ and hence } |V_i|=\sqrt{\frac{w_i}{w_s}}|V_s| \text{ (approx.)}$$

and, since $$(w_i/w_s)=\frac{(w_p/w_m)+2\epsilon}{(w_p/w_m)-2\epsilon}$$

which is approximately unity, we have nearly $|V_i|=|V_s|$.

The relation 17 between the arguments shows that the Equations 5 and 6 of the two amplified signals can be rewritten $$V_s=|V_s| \exp\left\{j\left(\frac{1}{2}w_pt-\frac{\pi}{4}-\psi_m\right)\right\}$$

$$V_i=|V_i| \exp\left\{j\left(\frac{1}{2}w_pt-\frac{\pi}{4}+\psi_m\right)\right\} \quad (18)$$

where $$\psi_m=w_mt-\phi_s-\frac{\pi}{4}$$

represents a signal at the selected output frequency $w_m$.

In mixer 10, the amplified waves at the input and idler frequencies are mixed with the wave from local oscillator 20 phase shifted 45° in 24. This local wave is represented as follows:

$$V_L=|V_L| \exp\left\{j\left(\frac{1}{2}w_pt-\frac{\pi}{4}\right)\right\} \quad (19)$$

When this equation is compared with Equations 18 it becomes evident that the output from the mixer 10 will contain only the desired intermediate-frequency ($\omega_m$) signal and that its voltage amplitude will be proportional to the sum of both the amplified voltage amplitudes $|V_s|$ and $|V_i|$. In terms of power, if S is the power of the input signal and G the gain of the parametric amplifier at the frequency $f_s$ of said input signal, then the power of the amplified signal at input frequency will be $$W_s=V_s^2=GS$$

and the power of the amplified signal at idler frequency $$W_i=GS\frac{f_i}{f_s}=GS \text{ (approx.)}$$

The corresponding voltages are proportional to the square roots of the power at each frequency. Thus the total amplified voltage is proportional to $2\sqrt{GS}$ and the total amplified power is 4 GS.

An important advantage of the system of the invention is its extreme simplicity. It has very few and simple components required in addition to the parametric amplifier. Only a single oscillator is necessary and because the pump frequency is comparatively low, this oscillator can conveniently be constructed from solid-state elements so as to be compact, lightweight and rugged. Also, the low pump frequency greatly reduces power requirements in operation, since the pump power is proportional to the pump frequency squared. A further advantage is the broad bandwidth of the system. When compared with conventional parametric amplifier systems operating in the degenerate mode, the system of this invention has a further important advantage in that it does not require the modulation spectrum of the input signal to be symmetrical, as earlier indicated. While the provision of the circulator load impedance 12 does introduce a small amount of additional noise into the system, the resulting slight decrease in signal to noise ratio is not significant in a majority of applications. In those cases where low-noise requirements are especially stringent, the deficiency just noted can be reduced by cooling the system to a suitably low temperature.

In an exemplary embodiment of the invention, the input signal frequency $f_s$ was 3000 megacycles, and the output frequency $f_m=35$ megacycles. Therefore, from Equation 2, taken with the plus sign, the pump frequency $f_p=6070$ megacycles. The idler frequency, from Equation 1, was $f_i=3070$ megacycles, and with a double sideband modulation of ±5 megacycles, the total bandwidth of the systems was $2f_m\pm2\delta f_s=80$ megacycles. The total oscillator frequency $\tfrac{1}{2} f_p$ was 3035 megacycles.

What I claim is:

1. A receiving system for producing an output signal at a prescribed intermediate frequency value from an ultra-high frequency input signal comprising:
- a parametric amplifier having a signal input-output line and a pump input line;
- means applying said input signal to said input-output line;
- a local oscillator producing a frequency equal to the algebraic sum of said input signal frequency and said prescribed intermediate output frequency;
- a mixer having an input connected to said input-output line and another input connected to receive said local oscillator frequency;
- a frequency doubler connected to receive said local oscillator frequency; and
- means applying the output frequency from the doubler as a pump signal to the pump input line of the parametric amplifier.

2. The system defined in claim 1, wherein the parametric amplifier includes filter means passing said input signal frequency and an idler frequency equal to the sum of said local oscillator frequency and said prescribed intermediate output frequency as generated in the parametric amplifier, together with modulation components thereof.

3. The system defined in claim 1, including phase shift means connected between said local oscillator and the mixer.

4. The system defined in claim 1, including filter means connected in said input signal-applying means and passing substantially only a desired input signal frequency together with a modulation frequency band thereof.

5. The system defined in claim 1, including means coupling said nput sgnal applyng means to sad nput-output line and coupling said input-output line to said mixer input, said coupling means including means for decoupling said mixer input from said input signal-applying means.

6. A receiver system comprising:

(a) parametric amplifying means including a source of modulated input signal;

a tuned circuit coupled to said source;

a variable reactance device coupled to said tuned circuit and having a pump signal input;

whereby said device will generate a plurality of amplified oscillations including a first oscillation at the input signal frequency and a second oscillation at an idler frequency equal to the difference of said pump signal frequency and the input signal frequency, both said amplified oscillations being modulated as said input signal;

said tuned circuit being tuned to pass both said first and second modulated amplified oscillations;

(b) mixer means having an input coupled to said tuned circuit to receive both said modulated amplified oscillations therefrom;

(c) oscillator means producing a wave at a frequency equal to the sum of said input signal frequency and a prescribed intermediate frequency;

(d) deriving means connected for applying said oscillator wave to adjustable phaseshift means, the resulting phaseshifted oscillator wave being applied to another mixer input; and (e) frequency doubler means connected to receive said oscillator wave and having its output connected to said pump signal input;

whereby said mixer will produce an output at said prescribed intermediate frequency modulated with the sum of the modulations of both said first and second amplified oscillations.

7. The system defined in claim 6, including circulator means having a first port connected to said signal source, a second port connected to said input-output line, a third port connected to said mixer input, and an absorbing load connected to a fourth port of said circulator means.

8. The system defined in claim 7, further including an intermediate-frequency amplifier stage connected to the output of the mixer means.

9. The system defined in claim 7 further including adjustable phaseshift means connected between said oscillator and said second input of the mixer means.

References Cited

UNITED STATES PATENTS 3,341,783 7/1966 Roulston ____________ 330—4.5

KATHLEEN CLAFFY, Prmary Examner

B. P. SMITH, Assistant Examner

U.S. Cl. X.R.

307—88.3; 330—4.5